United States Patent
Yoshida et al.

(10) Patent No.: US 9,450,158 B2
(45) Date of Patent: Sep. 20, 2016

(54) EPOXY RESIN COMPOSITION FOR OPTICAL SEMICONDUCTOR DEVICE, AND LEAD FRAME FOR OPTICAL SEMICONDUCTOR DEVICE, ENCAPSULATION TYPE OPTICAL SEMICONDUCTOR ELEMENT UNIT AND OPTICAL SEMICONDUCTOR DEVICE EACH OBTAINABLE BY USING THE EPOXY RESIN COMPOSITION

(71) Applicant: NITTO DENKO CORPORATION, Ibaraki-shi, Osaka (JP)

(72) Inventors: Naoko Yoshida, Ibaraki (JP); Kazuhiro Fuke, Ibaraki (JP); Hidenori Onishi, Ibaraki (JP); Ryusuke Naito, Ibaraki (JP); Yuichi Fukamichi, Ibaraki (JP)

(73) Assignee: NITTO DENKO CORPORATION, Ibaraki-shi (JP)

( * ) Notice: Subject to any disclaimer, the term of this patent is extended or adjusted under 35 U.S.C. 154(b) by 0 days.

(21) Appl. No.: 14/893,651

(22) PCT Filed: May 27, 2014

(86) PCT No.: PCT/JP2014/063896
§ 371 (c)(1),
(2) Date: Nov. 24, 2015

(87) PCT Pub. No.: WO2014/192707
PCT Pub. Date: Dec. 4, 2014

(65) Prior Publication Data
US 2016/0111611 A1    Apr. 21, 2016

(30) Foreign Application Priority Data

May 28, 2013 (JP) .................................. 2013-112285

(51) Int. Cl.
*H01L 33/00* (2010.01)
*H01L 33/56* (2010.01)
(Continued)

(52) U.S. Cl.
CPC ............ *H01L 33/56* (2013.01); *C08K 3/0033* (2013.01); *C08K 3/22* (2013.01); *C08K 5/09* (2013.01);
(Continued)

(58) Field of Classification Search
CPC . H01L 33/56; H01L 24/97; H01L 31/02002; H01L 33/60; H01L 33/62; H01L 2224/48247; C08K 3/0033
See application file for complete search history.

(56) References Cited

U.S. PATENT DOCUMENTS

| 5,641,997 A * | 6/1997 | Ohta ....................... C08L 63/00 257/788 |
| 2010/0140638 A1 | 6/2010 | Kotani et al. |

(Continued)

FOREIGN PATENT DOCUMENTS

| JP | 2005-36218 A | 2/2005 |
| JP | 2008-050573 A | 3/2008 |

(Continued)

OTHER PUBLICATIONS

Notification of Transmittal of Translation of the International Preliminary Report on Patentability (Form PCT/IB338) issued in counterpart International Application No. PCT/JP2014/063896 mailed Dec. 10, 2015 with Forms PCT/IB/373, PCT/IB/338 and PCT/ISA/237. (6 pages).

(Continued)

*Primary Examiner* — Yosef Gebreyesus
(74) *Attorney, Agent, or Firm* — Westerman, Hattori, Daniels & Adrian, LLP

(57) ABSTRACT

An optical semiconductor device includes a metal lead frame including first and second plate portions, an optical semiconductor element mounted on the metal lead frame, and a reflector provided around the optical semiconductor element. A material for the reflector is an epoxy resin composition containing: (A) an epoxy resin; (B) a curing agent; (C) a white pigment; (D) an inorganic filler; and (E) at least one of a carboxylic acid and water. Components (C) and (D) are present in a total proportion of 69 to 94 wt % based on the amount of the overall epoxy resin composition, and the component (E) is present in a proportion of 4 to 23 mol % based on the total amount of the components (B) and (E). The resin composition has a higher glass transition temperature, and is excellent in moldability and blocking resistance and substantially free from warpage.

19 Claims, 2 Drawing Sheets

(51) Int. Cl.
  *H01L 33/60* (2010.01)
  *H01L 33/62* (2010.01)
  *H01L 23/00* (2006.01)
  *C08K 5/09* (2006.01)
  *C08K 3/00* (2006.01)
  *C08K 3/22* (2006.01)
  *H01L 31/02* (2006.01)
  *H01L 31/0203* (2014.01)
  *H01L 31/0232* (2014.01)

(52) U.S. Cl.
  CPC ......... *H01L 24/97* (2013.01); *H01L 31/02002* (2013.01); *H01L 31/0203* (2013.01); *H01L 31/02327* (2013.01); *H01L 33/60* (2013.01); *H01L 33/62* (2013.01); *C08K 2003/2244* (2013.01); *H01L 2224/48091* (2013.01); *H01L 2224/48247* (2013.01); *H01L 2933/0058* (2013.01); *H01L 2933/0066* (2013.01)

(56) References Cited

U.S. PATENT DOCUMENTS

| | | | | |
|---|---|---|---|---|
| 2010/0200882 | A1* | 8/2010 | Kotani | C08G 59/3245 257/98 |
| 2011/0031527 | A1* | 2/2011 | Kotani | C07D 307/77 257/100 |
| 2011/0039978 | A1* | 2/2011 | Kotani | C08G 59/4215 523/218 |
| 2011/0054072 | A1* | 3/2011 | Sawada | C08G 59/3236 523/353 |
| 2012/0080705 | A1* | 4/2012 | Ohnishi | C08K 5/005 257/98 |
| 2012/0217532 | A1* | 8/2012 | Fuke | C08K 3/22 257/99 |
| 2013/0093313 | A1 | 4/2013 | Oyamada | |
| 2014/0191263 | A1* | 7/2014 | Wang | C08K 7/14 257/98 |

FOREIGN PATENT DOCUMENTS

| | | |
|---|---|---|
| JP | 2009-298901 A | 12/2009 |
| JP | 2011-258845 A | 12/2011 |
| JP | 2012-175030 A | 9/2012 |
| JP | 2013-40343 A | 2/2013 |
| JP | 2013-89644 A | 5/2013 |
| WO | 2008/059856 A1 | 5/2008 |

OTHER PUBLICATIONS

Office Action dated Feb. 16, 2016, issued in counterpart Japanese Patent Application No. 2014-525248, with English translation. (9 pages).

International Search Report dated Aug. 19, 2014, issued in counterpart application No. PCT/JP2014/063896 (1 page).

Notification of Reason for Refusal, dated Jul. 7, 2015, issued in counterpart application No. JP2014-525248, with English translation (13 pages).

* cited by examiner

EPOXY RESIN COMPOSITION FOR OPTICAL SEMICONDUCTOR DEVICE, AND LEAD FRAME FOR OPTICAL SEMICONDUCTOR DEVICE, ENCAPSULATION TYPE OPTICAL SEMICONDUCTOR ELEMENT UNIT AND OPTICAL SEMICONDUCTOR DEVICE EACH OBTAINABLE BY USING THE EPOXY RESIN COMPOSITION

TECHNICAL FIELD

The present invention relates to an epoxy resin composition to be used for an optical semiconductor device, e.g., as a material for a reflector (reflection portion) which reflects light emitted from an optical semiconductor element, and to a lead frame for an optical semiconductor device, an encapsulation type optical semiconductor element unit and an optical semiconductor device each obtainable by using the epoxy resin composition.

BACKGROUND ART

As shown in FIG. 1, for example, a conventional optical semiconductor device mounted with an optical semiconductor element includes a metal lead frame including a first plate portion 1 and a second plate portion 2, an optical semiconductor element 3 provided on the metal lead frame, and a reflector 4 of a resin material provided around the optical semiconductor element 3 and filling a gap between the first plate portion 1 and the second plate portion 2 for reflecting light. The optical semiconductor element 3 is disposed in a recess 5 defined by the metal lead frame and an inner peripheral surface of the reflector 4, and is encapsulated with a transparent resin such as a silicone resin containing a fluorescent material, as required, whereby an encapsulation resin layer 6 is formed. In FIG. 1, reference numerals 7, 8 designate bonding wires which are provided as required for electrically connecting the metal lead frame to the optical semiconductor element 3.

In recent years, the reflector 4 is formed, for example, by transfer-molding a thermosetting resin typified by an epoxy resin for production of the optical semiconductor device. It is a conventional practice to blend titanium oxide (white pigment) with the thermosetting resin, so that the reflector 4 can reflect the light emitted from the optical semiconductor element 3 (see PTL1).

The formation of the reflector 4 by the transfer molding and the like causes a problem of, for example, warpage. For suppression of the warpage, it is necessary to blend a higher proportion of an inorganic filler with a molding material essentially containing the thermosetting resin. Where the molding material is prepared by using a higher proportion of the inorganic filler, however, an additional problem arises that the molding material has an increased viscosity.

RELATED ART DOCUMENT

Patent Document

PTL1: JP-A-2011-258845

SUMMARY OF INVENTION

In order to impart the molding material with a fluidity necessary and sufficient for the transfer molding or the like, the melt viscosity of an organic component in the molding material should be reduced. In general, it is necessary to reduce the reaction ratio of the organic component, i.e., in order to reduce the glass transition temperature (Tg), to reduce the melt viscosity of the organic component. If the Tg of the organic component is reduced, however, the molding material (thermosetting resin composition) containing the organic component and the inorganic filler is liable to cause blocking, problematically reducing the workability. Where the inorganic filler is blended in a higher proportion for the suppression of the warpage or the like in the conventional process, therefore, it is difficult to ensure both the fluidity and the workability in the molding step. Thus, there is a demand for a molding material to be used for production of the optical semiconductor device to solve all these problems.

In view of the foregoing, it is an object of the present invention to provide an epoxy resin composition having a higher light reflectivity, a higher glass transition temperature (Tg) and excellent in moldability, blocking resistance and warpage resistance for an optical semiconductor device, and to provide a lead frame for an optical semiconductor device, an encapsulation type optical semiconductor element unit and an optical semiconductor device each obtainable by using the epoxy resin composition.

According to a first aspect of the present invention to achieve the above object, there is provided an epoxy resin composition for an optical semiconductor device, the epoxy resin composition containing: (A) an epoxy resin; (B) a curing agent; (C) a white pigment; (D) an inorganic filler; and (E) at least one of a carboxylic acid and water, wherein the components (C) and (D) are present in a total proportion of 69 to 94 wt % based on the amount of the overall epoxy resin composition, wherein the component (E) is present in a proportion of 4 to 23 mol % based on the total amount of the components (B) and (E).

According to a second aspect of the present invention, there is provided a plate-shaped lead frame for supporting an optical semiconductor element mounted on one of thicknesswise opposite surfaces thereof for an optical semiconductor device, the lead frame including: a plurality of plate portions spaced from each other by a gap; and a reflector formed in the gap by filling the gap with the epoxy resin composition of the first aspect and curing the epoxy resin composition. According to a third aspect of the present invention, there is provided a three-dimensional lead frame for an optical semiconductor device, the lead frame including: an optical semiconductor element mounting region; and a reflector at least having a portion surrounding the optical semiconductor element mounting region; wherein the reflector is formed by using the epoxy resin composition of the first aspect.

According to a fourth aspect of the present invention, there is provided an optical semiconductor device, which includes: plate portions spaced from each other by a gap and having an optical semiconductor element mounting region on one side thereof; an optical semiconductor element mounted at a predetermined position on the element mounting region; and a reflector formed in the gap by filling the gap with the epoxy resin composition of the first aspect and curing the epoxy resin composition. According to a fifth aspect of the present invention, there is provided an optical semiconductor device, which includes: a lead frame for an optical semiconductor device, the lead frame including an optical semiconductor element mounting region and a reflector at least having a portion surrounding the element mounting region; and an optical semiconductor element provided at a predetermined position on the lead frame;

wherein the reflector is formed by using the epoxy resin composition of the first aspect.

According to a sixth aspect of the present invention, there is provided an encapsulation type optical semiconductor element unit, which includes: an optical semiconductor element; a plurality of connection electrodes provided on a rear surface of the optical semiconductor element; a reflector provided on a side surface of the optical semiconductor element and formed from the epoxy resin composition of the first aspect; and an encapsulation layer covering an upper surface of the optical semiconductor element serving as a light emitting surface or a light receiving surface. According to a seventh aspect of the present invention, there is provided an optical semiconductor device, which includes: a wiring circuit board; and an encapsulation type optical semiconductor element unit mounted at a predetermined position on the wiring circuit board via connection electrodes of the encapsulation type optical semiconductor element unit; wherein the encapsulation type optical semiconductor element unit is the encapsulation type optical semiconductor element unit of the sixth aspect.

The inventors of the present invention conducted intensive studies to provide an epoxy resin composition, for an optical semiconductor device, which contains a white pigment and an inorganic filler in a higher proportion to suppress the warpage, and is substantially free from reduction in moldability due to the higher proportion of the inorganic filler and excellent in blocking resistance. In the studies, the inventors came up with an idea of using at least one of a carboxylic acid and water to prevent the reduction in moldability which may otherwise occur due to the higher proportion of the inorganic filler. That is, the warpage is effectively suppressed by setting the total proportion of the white pigment and the inorganic filler to a specific proportion, and the reduction in moldability due to the higher total proportion of the white pigment and the inorganic filler is suppressed by using at least one of the carboxylic acid and water in a specific proportion. As a result, the inventors of the present invention found that the resulting epoxy resin composition is capable of creating a warpage suppressing effect and maintaining its Tg at a higher level and is excellent in moldability and blocking resistance for use as a molding material, and attained the present invention.

Thus, the inventive epoxy resin composition for the optical semiconductor device contains the epoxy resin (A), the curing agent (B), the white pigment (C), the inorganic filler (D) and at least one of the carboxylic acid and the water (E). In the inventive epoxy resin composition, the components (C) and (D) are present in the specific total proportion, and the component (E) is present in the proportion falling within the specific range. Therefore, the epoxy resin composition is excellent in moldability and blocking resistance, and capable of suppressing the warpage and maintaining its Tg at a higher level. Accordingly, the optical semiconductor device including the reflector formed by using the epoxy resin composition is highly reliable. This makes it possible to produce the optical semiconductor device by a transfer molding process or the like with the use of a mold, and is advantageous for mass production.

Where the white pigment (C) is present in the epoxy resin composition in a proportion falling within a specific range, the epoxy resin composition is further excellent in light reflectivity and moldability.

Where the epoxy resin composition contains a modifier (F) in addition to the aforementioned components, the epoxy resin composition is further excellent in blocking resistance.

Where the modifier (F) is an alcohol compound, the glass transition temperature (Tg) is effectively improved.

Where the component (C) is at least one of titanium oxide and zirconium oxide, the glass transition temperature (Tg) is further effectively improved.

Where the component (E) is a solid carboxylic acid, the epoxy resin composition is improved in handleability and hence in workability.

DESCRIPTION OF EMBODIMENTS

Figure 1:
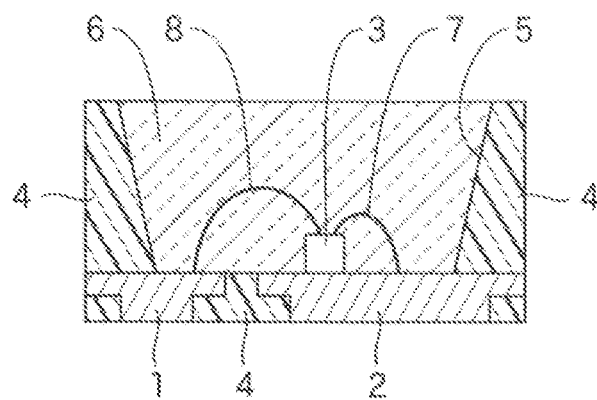
FIG. 1 is a sectional view schematically showing the construction of an optical semiconductor device.

Components of the present invention will hereinafter be described by way of embodiments (typical embodiments) of the present invention. It should be understood that the invention be not limited to the embodiments.

The present invention will hereinafter be described in detail.

As described above, an inventive epoxy resin composition for an optical semiconductor device (hereinafter referred simply as "epoxy resin composition") is used, for example, as a material for a reflector 4 of an optical semiconductor device shown in FIG. 1. The epoxy resin composition includes: (A) an epoxy resin; (B) a curing agent; (C) a white pigment; (D) an inorganic filler; and (E) at least one of a carboxylic acid and water. The epoxy resin is used typically in the form of liquid or powder, or in the form of tablets prepared by compacting the powder as the material for the reflector 4.

<A: Epoxy Resin>

Examples of the epoxy resin (A) include bisphenol-A epoxy resins, bisphenol-F epoxy resins, bisphenol-S epoxy resins, novolak type epoxy resins such as phenol novolak epoxy resins and cresol novolak epoxy resin, alicyclic epoxy resins, nitrogen-containing cyclic epoxy resins such as monoglycidyl isocyanurate, diglycidyl isocyanurate, triglycidyl isocyanurate and hydantoin epoxy resins, hydrogenated bisphenol-A epoxy resins, hydrogenated bisphenol-F epoxy resins, aliphatic epoxy resins, glycidyl ether epoxy resins, diglycidyl ether resins such as of alkyl-substituted bisphenols, glycidylamine epoxy resins obtained by a reaction between epichlorohydrin and polyamines such as of diaminodiphenylmethane and isocyanuric acid, linear aliphatic epoxy resins obtained by oxidizing olefin bonds with a peracid such as peracetic acid, biphenyl epoxy resins which typically provide lower water absorption cured resins, dicyclic epoxy resins, and naphthalene epoxy resins, which may be used alone or in combination. Of these epoxy resins, alicyclic epoxy resins and triglycidyl isocyanurate resins having isocyanuric rings are preferably used alone or in combination because they are excellent in transparency and discoloration resistance. For similar reasons, diglycidyl ester resins of dicarboxylic acids such as phthalic acid, tetrahydrophthalic acid, hexahydrophthalic acid, methyltetrahydrophthalic acid, nadic acid and methylnadic acid are also preferred. Other examples of the epoxy resin include glycidyl ester resins such as of nuclear-hydrogenated trimellitic acid and nuclear-hydrogenated pyromellitic acid having alicyclic structures including hydrogenated aromatic rings.

The epoxy resin (A) may be solid or liquid at room temperature. In general, the epoxy resin to be used preferably has an average epoxy equivalent of 90 to 1,000. Where the epoxy resin (A) is solid, the epoxy resin preferably has a softening point of 50° C. to 160° C. from the viewpoint of handling ease. If the epoxy equivalent is excessively small, the epoxy resin composition is liable to be brittle in a cured state. If the epoxy equivalent is excessively great, the epoxy resin composition is liable to have a lower glass transition temperature (Tg) in a cured state.

<B: Curing Agent>

Examples of the curing agent (B) include acid anhydride curing agents and isocyanuric acid derivative curing agents, which may be used alone or in combination. Of these curing agents, the acid anhydride curing agents are preferably used from the viewpoint of heat resistance and light resistance.

Examples of the acid anhydride curing agents include phthalic anhydride, maleic anhydride, trimellitic anhydride, pyromellitic anhydride, hexahydrophthalic anhydride, 3-methylhexahydrophthalic anhydride, 4-methylhexahydrophthalic anhydride, tetrahydrophthalic anhydride, 3-methyltetrahydrophthalic anhydride, 4-methyltetrahydrophthalic anhydride, methylnadic anhydride, nadic anhydride, glutaric anhydride, dimethylglutaric anhydride, diethylglutaric anhydride, methylhexahydrophthalic anhydride and methyltetrahydrophthalic anhydride, which may be used alone or in combination. Further, oligomers containing any of these acid anhydrides as a terminal group or a side chain of a saturated aliphatic chain skeleton, an unsaturated aliphatic chain skeleton or a silicone skeleton may be used alone or in combination together with any of the acid anhydrides. Of these acid anhydride curing agents, phthalic anhydride, hexahydrophthalic anhydride, 3-methylhexahydrophthalic anhydride, 4-methylhexahydrophthalic anhydride, tetrahydrophthalic anhydride, 3-methyltetrahydrophthalic anhydride and 4-methyltetrahydrophthalic anhydride are preferably used. The acid anhydride curing agents are preferably colorless or pale yellow.

Examples of the isocyanuric acid derivative curing agents include 1,3,5-tris(1-carboxymethyl)isocyanurate, 1,3,5-tris(2-carboxyethyl)isocyanurate, 1,3,5-tris(3-carboxypropyl)isocyanurate and 1,3-bis(2-carboxyethyl)isocyanurate, which may be used alone or in combination. Further, the isocyanuric acid derivative curing agents are preferably colorless or pale yellow.

The total proportion of the epoxy resin (A) and the curing agent (B) is preferably such that the amount of an active group (an acid anhydride group or a carboxylic group) of the curing agent (B) reactive with the epoxy group of the epoxy resin (A) is 0.4 to 1.4 equivalents, more preferably 0.6 to 1.2 equivalents, based on 1 equivalent of the epoxy group of the epoxy resin (A). If the amount of the active group is excessively small, the epoxy resin composition is liable to have a lower curing rate and to have a lower glass transition temperature (Tg) in a cured state. If the amount of the active group is excessively great, the moisture resistance is liable to be reduced.

Besides the acid anhydride curing agents and the isocyanuric acid derivative curing agents described above, phenolic curing agents, amine curing agents, curing agents obtained by partially esterifying any of the above acid anhydride curing agents with an alcohol, and other curing agents for the epoxy resin, for example, may be used alone or in combination as the curing agent (B) depending on the purpose and the application of the resin composition. Where any of these curing agents is used, the aforementioned blend proportion (equivalent ratio) of the curing agent (B) may be employed.

<C: White Pigment>

Examples of the white pigment (C) to be used together with the components (A) and (B) include inorganic white pigments such as magnesium oxide, antimony oxide, titanium oxide, zirconium oxide, zinc oxide, white lead, kaolin, alumina, calcium carbonate, barium carbonate, barium sulfate, zinc sulfate and zinc sulfide, which may be used alone or in combination. Particularly, titanium oxide and zirconium oxide are preferably used from the viewpoint of excellent light reflectivity. Titanium oxide having a rutile crystalline structure and zirconium oxide having a monoclinic crystalline structure are particularly preferred. The white pigment (C) preferably has an average particle diameter of 0.05 to 5.0 μm from the viewpoint of fluidity and light blocking property, and particularly preferably has an average particle diameter of 0.08 to 4.5 μm from the viewpoint of light reflection. The average particle diameter may be measured, for example, by means of a laser diffraction scattering particle size distribution analyzer. Further, the white pigment (C) preferably has a specific surface area of 1 to 30 $m^2/g$. The specific surface area may be measured by means of an automatic specific surface area measuring apparatus by a gas adsorption method.

The proportion of the white pigment (C) is preferably set to a range of 3 to 90 wt % based on the amount of the overall epoxy resin composition. From the viewpoint of discoloration and light reflectivity, the proportion of the white pigment (C) is particularly preferably set to a range of 10 to 40 wt % based on the amount of the overall epoxy resin composition. If the proportion of the white pigment (C) is excessively small, it will be difficult to provide sufficient light reflection, and the heat resistance is liable to be reduced. If the proportion of the white pigment (C) is excessively great, it will be difficult to prepare the epoxy resin composition by kneading because the viscosity of the epoxy resin composition is significantly increased.

<D: Inorganic Filler>

Examples of the inorganic filler (D) to be used together with the components (A) to (C) include quartz glass powder, talc, silica powder such as fused silica powder and crystalline silica powder, alumina powder, aluminum nitride powder, boron nitride powder and silicon nitride powder. Particularly, silica powder is preferably used from the viewpoint of reduction of linear expansion coefficient, and spherical fused silica powder is preferably used from the viewpoint of higher fillability and higher fluidity. Consideration is preferably given to the particle diameters and the particle diameter distribution of the inorganic filler (D) in combination with the particle diameters and the particle diameter distribution of the white pigment (C) so as to minimize burrs when the epoxy resin composition is molded by a transfer molding method or the like. More specifically, the inorganic filler (D) preferably has an average particle diameter of 5 to 100 μm, particularly preferably 10 to 40 μm. As in the former case, the average particle diameter may be measured, for example, by means of a laser diffraction scattering particle size distribution analyzer.

The proportion of the inorganic filler (D) should be set so that the total proportion of the white pigment (C) and the inorganic filler (D) is 69 to 94 wt %, particularly preferably 80 to 90 wt %, based on the amount of the overall epoxy resin composition. If the total proportion is excessively small, it will be impossible to create the warpage suppressing effect during the molding. If the total proportion is excessively great, it will be impossible to knead the ingredients of the epoxy resin composition because an excessively great load acts on a kneader. This makes it impossible to prepare the epoxy resin composition as the molding material.

<E: At Least One of Carboxylic Acid and Water>

A feature of the present invention is that at least one of carboxylic acid and water (E) is used together with the components (A) to (D). The carboxylic acid preferably has a valence of 2 or more. If the carboxylic acid is monovalent, the glass transition temperature (Tg) is liable to be reduced because of a lower polymerization degree. The carboxylic acid preferably has no unsaturated bond but at least has a cyclic skeleton in its chemical structure. If the carboxylic acid has a branched or unbranched chain structure, the Tg is liable to be reduced because of a plasticity imparting effect. If the carboxylic acid has an unsaturated bond, the unsaturated bond is liable to cause discoloration due to thermal oxidation and the like. As a result, the light reflectivity is liable to be reduced. Examples of the carboxylic acid to be used in the present invention include phthalic acid, trimellitic acid, pyromellitic acid, methyltetrahydrophthalic acid, tetrahydrophthalic acid, hexahydrophthalic acid, methylhexahydrophthalic acid, methylnadic acid and nadic acid. Particularly, hexahydrophthalic acid and methylhexahydrophthalic acid are preferably used. These may be used alone or in combination.

On the other hand, the water is not particularly limited, but preferably contains little impurity. Preferred examples of the water include deionized water and distilled water. Where the water is used as the component (E), the acid anhydride curing agent described above partly reacts with the water to form a carboxylic acid. This creates substantially the same effect as in the case where the carboxylic acid is used. Therefore, the amounts of the acid anhydride and the water to be used should be adjusted so that the concentration of the carboxylic acid falls within a range to be described later. More specifically, the acid anhydride curing agent should be blended in an amount more than necessary in consideration of the amount of the acid anhydride curing agent to be consumed by a reaction between the acid anhydride curing agent and the water.

In the present invention, the component (E) is preferably solid at room temperature (25° C.) for the handling ease of the material and, therefore, a solid carboxylic acid is preferably used. Where the solid carboxylic acid is used, the solid carboxylic acid has an average particle diameter of not greater than 500 μm, preferably not greater than 100 μm, more preferably not greater than 50 μm, from the viewpoint of dispersibility. As in the former case, the maximum particle diameter may be measured by means of a laser diffraction scattering particle size distribution analyzer.

The proportion of the component (E) should be 4 to 23 mol %, and is preferably 8 to 20 mol %, based on the total proportion of the components (B) and (E). If the proportion of the component (E) is excessively small, the moldability is liable to be reduced. If the proportion of the component (E) is excessively great, the viscosity is liable to be increased because of a rapid reaction during the kneading. The proportion of the component (E) is calculated in the following manner. The proportion of the component (E) is expressed by (Number of molecules of carboxylic acid)/(Number of molecules of curing agent), and the number of the molecules of the carboxylic acid and the number of the molecules of the curing agent are each expressed by (Blended weight)/(Molecular weight). More specifically, the proportion of the component (E) is calculated from the following expression:

(Carboxylic acid amount(mol))/[(Carboxylic acid amount(mol))+(Curing agent amount(mol))]×100

Where the water is used as the component (E), (Added water amount (mol))=(Amount (mol) of carboxylic acid to be generated by reaction)=(Amount (mol) of acid anhydride curing agent to be consumed by reaction with water) is satisfied. Therefore, the amount of the water to be used is adjusted as described above. More specifically, the acid anhydride curing agent should be blended in an amount more than necessary.

<Other Additives>

In addition to the components (A) to (E) described above, a curing accelerator, a release agent and a silane coupling agent may be blended in the inventive epoxy resin composition as required. Further, various additives such as a modifier, an antioxidant, a flame retardant, a defoaming agent, a leveling agent and a UV absorbing agent may be blended in the epoxy resin composition.

Examples of the curing accelerator include: tertiary amines such as 1,8-diazabicyclo[5.4.0]undecene-7, triethylenediamine, tri-2,4,6-dimethylaminomethylphenol, N,N-dimethylbenzylamine, N,N-dimethylaminobenzene, and N,N-dimethylaminocyclohexane; imidazoles such as 2-ethyl-4-methylimidazole and 2-methylimidazole; phosphorus compounds such as triphenylphosphine, tetraphenylphosphonium tetrafluoroborate, tetraphenylphosphonium tetraphenylborate, tetra-n-butylphosphonium bromide, tetraphenylphosphonium bromide, methyltributylphosphonium dimethyl phosphate and tetra-n-butylphosphonium o,o-diethyl phosphorodithioate; quaternary ammonium salts; organic metal salts; and derivatives of these compounds, which may be used alone or in combination. Of these curing accelerators, any of the tertiary amines, imidazoles and phosphorus compounds is preferably used. In order to provide a less-colored transparent tough cured resin, it is particularly preferred to use any of the tertiary amines and the phosphorus compounds.

The proportion of the curing accelerator is preferably set to 0.001 to 8.0 wt %, more preferably 0.01 to 3.0 wt %, based on the amount of the epoxy resin (A). If the proportion of the curing accelerator is excessively small, it will be impossible to create a sufficient curing accelerating effect. If the proportion of the curing accelerator is excessively great, the resulting cured resin is liable to suffer from discoloration.

<Release Agent>

Various release agents are usable as the release agent. Particularly, a release agent having an ether bond is preferably used, and an example of such a release agent is a release agent having a structural formula represented by the following general formula (1):

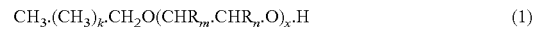

$$CH_3 \cdot (CH_3)_k \cdot CH_2O(CHR_m \cdot CHR_n \cdot O)_x \cdot H \quad (1)$$

wherein $R_m$ and $R_n$, which may be the same or different, are each a hydrogen atom or a monovalent alkyl group, k is a positive number of 1 to 100, and x is a positive number of 1 to 100.

In the formula (1), $R_m$ and $R_n$ are each a hydrogen atom or a monovalent alkyl group, k is preferably a positive number of 10 to 50, and x is preferably a positive number of 3 to 30. More preferably, $R_m$ and $R_n$ are each a hydrogen atom, k is a positive number of 28 to 48, and x is a positive number of 5 to 20. If the repeating number k is excessively small, the releasability is liable to be reduced. If the repeating number x is excessively small, the dispersibility is liable to be reduced, making it impossible to stably ensure the strength and the releasability. If the repeating number k is excessively great, on the other hand, it will be difficult to knead the epoxy resin composition due to a higher melting point, thereby causing inconvenience in the epoxy resin composition preparing process. If the repeating number x is excessively great, the releasability is liable to be reduced.

The proportion of the release agent preferably falls within a range of 0.01 to 3 wt %, more preferably 0.1 to 1 wt %, based on the amount of the overall epoxy resin composition. If the proportion of the release agent is excessively small or excessively great, the resulting cured resin is liable to have insufficient strength or poorer releasability.

Examples of the silane coupling agent include 3-mercaptopropyltrimethoxysilane, 3-glycidoxypropyltrimethoxysilane and 2-(3,4-epoxycyclohexyl)ethyltrimethoxysilane, which may be used alone or in combination.

Examples of the modifier include silicone compounds and alcoholic compounds. Particularly, the alcoholic compounds are preferably used from a viewpoint that reduction in Tg due to addition of the modifier can be suppressed.

Examples of the alcohol compounds include bifunctional alcohols (so-called divalent alcohols) and trifunctional and higher-functional alcohols (so-called trivalent and higher-valent alcohols). Examples of the divalent alcohols include: compounds having aliphatic skeletons such as ethylene glycol, diethylene glycol, triethylene glycol, propylene glycol, neopentyl glycol, polyethylene glycol, spiroglycol, dioxane glycol and 1,3-butanediol; and compounds having aromatic skeletons such as 1,3-benzenedimethanol, 1,4-benzenedimethanol, 2-benzyloxy-1,3-propanediol and 2,2'-biphenol. Examples of the trivalent or higher-valent alcohols include: compounds having aliphatic skeletons such as glycerol, 1,2,3-butanetriol, 1,2,4-butanetriol, trimethylolpropane, 1,2,3-cyclohexanetriol, 1,2,7-heptanetriol and 1,2,8-octanetriol, and compounds having aromatic skeletons such as 1,2,3-benzenetriol, 1,2,4-benzenetriol and 3,4,5-toluenetriol. Particularly, it is preferred to use alcohol compounds each having a smaller carbon number and an aliphatic skeleton, such as ethylene glycol, diethylene glycol, propylene glycol, neopentyl glycol, glycerol and trimethylolpropane, which are less liable to suffer from reduction in Tg and discoloration. More preferably, neopentyl glycol is used as the divalent alcohol, and trimethylolpropane is used as the trivalent or higher-valent alcohol. Where the modifier is blended, the proportion of the modifier is preferably set to not greater than 5 wt %, more preferably 0.1 to 1 wt %, based on the amount of the overall epoxy resin composition.

Examples of the antioxidant include phenol compounds, amine compounds, organic sulfur compounds and phosphine compounds.

Examples of the flame retardant include metal hydroxides such as magnesium hydroxide, bromine-containing flame retardants, nitrogen-containing flame retardants and phosphorus-containing flame retardants. Further, an antimony trioxide flame retardant promoter is also usable.

Examples of the defoaming agent include conventionally known defoaming agents such as silicone defoaming agents.

<Epoxy Resin Composition>

The inventive epoxy resin composition may be produced, for example, in the following manner. The components (A) to (E), the curing accelerator and the release agent and, as required, the various additives are blended, and the resulting blend is kneaded and melt-mixed by means of a kneading machine or the like. Then, the resulting mixture is cooled and pulverized. Thus, the epoxy resin composition is prepared in a powdery form.

A cured resin obtained by curing the epoxy resin composition preferably has a light reflectivity of not lower than 80%, more preferably not lower than 90%, at a wavelength of 450 to 800 nm. The upper limit of the light reflectivity is generally 100%. More specifically, the light reflectivity of the cured resin is preferably 85 to 96% at a wavelength of 450 nm. The light reflectivity is measured, for example, in the following manner. A 1-mm thick cured resin sample is formed, for example, by molding the epoxy resin composition at 175° C. for 2 minutes and curing the epoxy resin composition at 175° C. for 3 hours, and the reflectivity of the cured resin is measured at a wavelength in the aforementioned range at a room temperature (25±10° C.) by means of a spectrophotometer (e.g., SPECTROPHOTOMETER V-670 available from JSCO Corporation).

An optical semiconductor device is produced, for example, in the following manner by using the inventive epoxy resin composition. A metal lead frame is placed in a mold of a transfer molding machine, and a reflector is formed by transfer-molding the epoxy resin composition. Thus, the metal lead frame for the optical semiconductor device is formed with the loop-shaped reflector which surrounds an optical semiconductor element mounting region of the metal lead frame. Then, an optical semiconductor element is mounted on the optical semiconductor element mounting region of the metal lead frame inside the reflector, and electrically connected to the metal lead frame with the use of bonding wires. Then, an inside space of the reflector containing the optical semiconductor element is sealed with a silicone resin or the like, whereby an encapsulation resin layer is formed. Thus, the optical semiconductor device is produced, which has a three-dimensional shape (cup shape), for example, as shown in FIG. 1. The optical semiconductor device includes a metal lead frame including a first plate portion 1 and a second plate portion 2, an optical semiconductor element 3 mounted on the second plate portion 2 of the metal lead frame, and a reflector 4 formed from the inventive epoxy resin composition as surrounding the optical semiconductor element 3 for light reflection. A transparent encapsulation resin layer 6 is provided in a recess 5 defined by the metal lead frame and an inner peripheral surface of the reflector 4 to encapsulate the optical semiconductor element 3. As required, the encapsulation resin layer 6 contains a fluorescent material. In FIG. 1, reference numerals 7, 8 designate bonding wires which electrically connect the optical semiconductor element 3 to the metal lead frame.

In the present invention, various kinds of substrates are usable instead of the metal lead frame of FIG. 1. Examples of the substrates include organic substrates, inorganic substrates and flexible printed boards. An injection molding method may be employed instead of the transfer molding method for the formation of the reflector.

Figure 2:
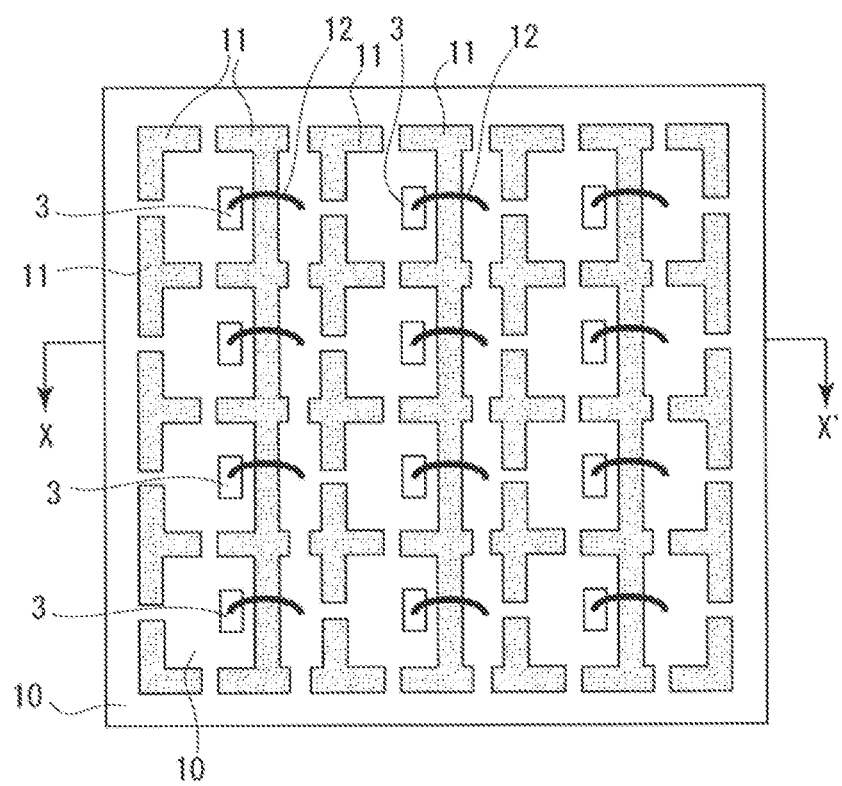
FIG. 2 is a plan view schematically showing the construction of another optical semiconductor device.
Figure 3:
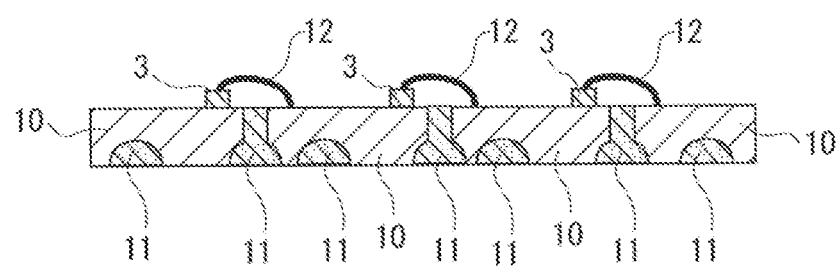
FIG. 3 is a schematic sectional view of the optical semiconductor device of FIG. 2 taken on line X-X' in the plan view (FIG. 2).

An optical semiconductor device having a configuration different from that described above and employing a plate-shaped lead frame is shown in FIG. 2 and FIG. 3 (a sectional view taken on line X-X' in FIG. 2). The optical semiconductor device includes metal lead frames 10 spaced from each other by gaps, optical semiconductor elements 3 mounted at predetermined positions on one side of the metal lead frames 10 in the thickness direction of the metal lead frames, and reflectors 11 formed from the inventive epoxy resin composition in the gaps between the metal lead frames 10 for light reflection. As shown in FIG. 3, the reflectors 11 are respectively formed in the gaps between the metal lead frames 10 by filling the gaps with the inventive epoxy resin composition and curing the epoxy resin composition. In FIGS. 2 and 3, reference numeral 12 designates bonding wires which electrically connect the optical semiconductor elements 3 to the corresponding metal lead frames 10. For production of the optical semiconductor device, the metal lead frames 10 are placed in a mold of a transfer molding machine, and the gaps by which the metal lead frames 10 are spaced from each other and recesses formed in surfaces of the metal lead frames 10 opposite from the optical semiconductor element mounting surfaces are filled with the epoxy resin composition, which is in turn cured to form the reflectors 11. Then, the optical semiconductor elements 3 are mounted at predetermined positions on optical semiconductor element mounting regions of the metal lead frames 10, and then are electrically connected to the corresponding metal lead frames 10 with the use of bonding wires 12. In this manner, the optical semiconductor device shown in FIGS. 2 and 3 is produced.

<Encapsulation Type Optical Semiconductor Element Unit>

Figure 4:
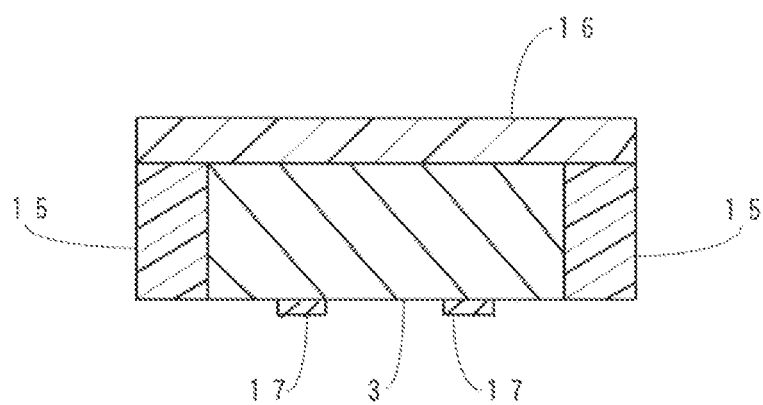
FIG. 4 is a sectional view schematically showing the construction of an encapsulation type optical semiconductor element unit.

An encapsulation type optical semiconductor element unit produced by using the inventive epoxy resin composition as a reflector material is shown in FIG. 4. The encapsulation type optical semiconductor element unit includes an optical semiconductor element 3, a reflector 15 formed from the inventive epoxy resin composition and provided on the entire side surfaces of the optical semiconductor element 3 for light reflection, and an encapsulation layer 16 covering an upper portion (a light emitting surface or a light receiving surface) of the optical semiconductor element 3. In FIG. 4, a reference numeral 17 designates connection electrodes (bumps). The encapsulation layer 16 is made of an epoxy resin, a silicone resin, or an inorganic material such as glass or ceramic. The encapsulation layer 16 may contain a fluorescent material dispersed therein, or may contain no fluorescent material.

The encapsulation type optical semiconductor element unit may be produced, for example, in the following manner. Flip-chip type optical semiconductor (light emitting) elements 3 (e.g., blue LED chips or the like) each having connection electrodes (bumps) 17 provided on a surface thereof opposite from a light emitting surface thereof are placed in predetermined spaced relation on an adhesive surface of a dicing tape or the like with their connection electrodes (bumps) 17 embedded in the adhesive surface of the dicing tape. Then, the optical semiconductor elements 3 are each encapsulated with the inventive epoxy resin composition by means of a compression molding machine, a transfer molding machine or an injection molding machine with the entire side surfaces and the light emitting surfaces thereof covered with the inventive epoxy resin composition. Then, the epoxy resin composition is post-heated by means of a dryer or the like, and a heat-curing reaction of the epoxy resin composition is completed. Thus, reflectors 15 for light reflection are formed from the inventive epoxy resin composition on the entire side surfaces of the respective optical semiconductor elements 3. Subsequently, portions of the reflectors 15 formed on the light emitting surfaces are ground off to expose the light emitting surfaces. Then, the exposed light emitting surfaces are each surrounded by a dam material and, in this state, an encapsulation material such as a silicone resin is applied on the exposed light emitting surfaces. Alternatively, an encapsulation material sheet is applied on the light emitting surfaces. Thus, the encapsulation layers 16 are formed. Then, the resulting product is diced along center lines intermediate between the optical semiconductor elements 3 by means of a blade dicer, whereby the elements are individually separated from each other. Subsequently, the dicing tape is stretched to reduce the adhesiveness thereof. Thus, the encapsulation type optical semiconductor element units each including the optical semiconductor element 3 formed with the reflector 15 on the dicing tape are completely separated from each other. Thus, the encapsulation type optical semiconductor element unit shown in FIG. 4 is produced.

In an optical semiconductor device employing the encapsulation type optical semiconductor element unit thus produced, the optical semiconductor element 3 is mounted at a predetermined circuit position on a wiring circuit board via connection electrodes 17 of the encapsulation type optical semiconductor element unit.

EXAMPLES

Inventive examples will hereinafter be described in conjunction with comparative examples. However, it should be understood that the invention be not limited to these inventive examples.

The following ingredients were prepared before preparation of epoxy resin compositions.

[Epoxy Resin]
Tris(2,3-epoxypropyl)isocyanurate (TEPIC-S available from Nissan Chemical Industries, Ltd.)

[Curing Agent]
A mixture containing 4-methylhexahydrophthalic anhydride (x) and hexahydrophthalic anhydride (y) in a mixing weight ratio of x:y=70:30 (RIKACID MH-700 available from New Japan Chemical Co., Ltd.)

[Carboxylic Acid]
Hexahydrophthalic acid (RIKACID HH-W in solid form treated so as to have an average particle diameter of not greater than 500 μm, and available from New Japan Chemical Co., Ltd.)

[Water]
Deionized Water

[Plasticizer f1]
Neopentyl glycol (available from Mitsubishi Gas Chemical Company, Inc.)

[Plasticizer f2]
Trimethylolpropane (available from Mitsubishi Gas Chemical Company, Inc.)

[Curing Accelerator]
Methyl tributylphosphonium dimethyl phosphate (PX-4MP available from Nippon Chemical Industrial Co., Ltd.)

[Silane Coupling Agent a]
3-Mercaptopropyltrimethoxysilane (KBM-803 available from Shin-Etsu Chemical Co., Ltd.)

[Silane Coupling Agent b]
3-Glycidoxypropyltrimethoxysilane (KBM-403 available from Shin-Etsu Chemical Co., Ltd.)

[Release Agent]
C (carbon number) >14, Ethoxylated alcohol {having a carbon number of greater than 14}/ethylene homopolymer (UNT750 available from Marubishi Oil Chemical Co., Ltd.)

[Antioxidant]
Tetrakis[methylene-3-(3,5-di-tert-butyl-4-hydroxyphenyl)propionate (SONGNOX 1010 available from Kyodo Chemical Co., Ltd.)

[Silica Powder]
Fused spherical silica powder (amorphous) (having an average particle diameter of 20 μm)

[White Pigment c1]
Rutile type titanium oxide (having an average particle diameter of 0.28 μm and a specific surface area of 13 m²/g)
[White Pigment c2]
Zirconium oxide (having an average particle diameter of 4.3 μm and a specific surface area of 3.8 m²/g)

Examples 1 to 17 and Comparative Examples 1 to 4

Intended powdery epoxy resin compositions were each prepared by blending ingredients shown below in Tables 1 to 3 in proportions shown in Tables 1 to 3, melt-mixing the resulting blend (at a temperature of 100° C. to 160° C.) by means of a kneader, aging the resulting mixture, cooling the mixture to a room temperature (25° C.), and pulverizing the mixture.

The epoxy resin compositions of Examples and Comparative Examples thus prepared were evaluated for glass transition temperature (Tg), initial light reflectivity, blocking resistance, spiral flow (SF) value and warpage by the following measurement methods. The results are shown below in Tables 1 to 3.

[Glass Transition Temperature (Tg)]
A square columnar test piece having a sectional size of 5 mm×5 mm and a length of 20 mm was formed from each of the epoxy resin compositions under predetermined curing conditions (by molding at 175° C. for 2 minutes and curing at 175° C. for 3 hours). With the use of the test piece, the glass transition temperature was measured by increasing the temperature from 25° C. to 220° C. at a temperature increasing rate of 2° C./min by means of a thermomechanical analyzer (TMA-50 available from Shimadzu Corporation).

[Initial Light Reflectivity]
A 1-mm thick test piece was formed from each of the epoxy resin compositions under predetermined curing conditions (by molding at 175° C. for 2 minutes and curing at 175° C. for 3 hours). The light reflectivity of the test piece (of the cured resin) was measured at a room temperature (25° C.). The measurement of the light reflectivity was performed at a wavelength of 450 nm at a room temperature (25° C.) by using a spectrophotometer V-670 available from JSCO Corporation as a measurement apparatus.

[Blocking Resistance]
The powdery epoxy resin compositions (50 g) were each put in a 100-ml beaker, and then a load of 400 g was applied to the powdery epoxy resin composition from above. In this state, the powdery epoxy resin composition was allowed to stand at 25° C. for 3 hours, and then sieved through a 10-mm mesh sieve. An epoxy resin composition having a blocking product (agglomeration product) remaining on the sieve was rated as unacceptable (×). An epoxy resin composition having no blocking product remaining on the sieve but having a visually perceivable agglomeration product was rated as acceptable (Δ), and an epoxy resin composition having neither the blocking product remaining on the sieve nor the visually perceivable agglomeration product was rated as excellent (○).

[Spiral Flow (SF) Value]
In conformity with EMMI 1-66, the epoxy resin compositions were each injected into a spiral flow measurement mold at a molding temperature of 175° C. at a mold clamping pressure of 18 MPa at an injection pressure of 4.9 MPa, and a scale engraved on the mold was visually checked to measure the spiral flow (SF) value (cm). In the present invention, an epoxy resin composition having an SF value of not less than 60 cm was rated as acceptable.

[Warpage Evaluation]
An optical semiconductor (light emitting) device having the construction shown in FIG. 1 was produced by employing each of the epoxy resin compositions. A lead frame was produced by setting a copper (silver-plated) lead frame body in a transfer molding machine and transfer-molding the epoxy resin composition under predetermined molding conditions (by molding at 175° C. for 2 minutes and curing at 175° C. for 2 hours). The lead frame had an outer size of 50 mm×59 mm, and included structures arranged in a 13×13 vertical and horizontal array and, as shown in FIG. 1, each including a reflector 4, a recess 5 defined in the reflector 4, and a first plate portion 1 and a second plate portion 2 provided in the recess 5.

The lead frame (sample) thus produced was allowed to stand still on a flat base at room temperature (25° C.). Then, a maximum height and a minimum height of the sample were measured from the base by means of a laser displacement meter (temperature-variable laser three-dimensional measurement apparatus available from Ti-Tech Co., Ltd.) and a difference between the maximum height and the minimum height was determined as a maximum warpage. A sample having a maximum warpage of less than 1.5 mm was rated as acceptable (○), and a sample having a maximum warpage of not less than 1.5 mm was rated as unacceptable (×).

TABLE 1

| | Example (parts by weight) | | | | | | | | | |
|---|---|---|---|---|---|---|---|---|---|---|
| | 1 | 2 | 3 | 4 | 5 | 6 | 7 | 8 | 9 | 10 |
| Epoxy resin (A) | 100 | 100 | 100 | 100 | 100 | 100 | 100 | 100 | 100 | 100 |
| Curing agent (B) | 127 | 121 | 119 | 108 | 108 | 132 | 132 | 121 | 121 | 121 |
| Carboxylic acid (E) | 5.5 | 11 | 14 | 25 | 28 | — | — | 11 | 11 | 11 |
| Water (E) | — | — | — | — | — | 0.6 | 1.2 | — | — | — |
| Plasticizer f1 (F) | 5 | 5 | 5 | 5 | 5 | 5 | 5 | 5 | 5 | 5 |
| Plasticizer f2 (F) | — | — | — | — | — | — | — | — | — | — |
| Curing accelerator | 1 | 1 | 1 | 1 | 1 | 1 | 1 | 1 | 1 | 1 |
| Silane coupling agent a | 4 | 4 | 4 | 4 | 4 | 4 | 4 | 4 | 4 | 4 |
| Silane coupling agent b | 7 | 7 | 7 | 7 | 7 | 7 | 7 | 7 | 7 | 7 |
| Release agent | 4 | 4 | 4 | 4 | 4 | 4 | 4 | 4 | 4 | 4 |
| Antioxidant | 1.5 | 1.5 | 1.5 | 1.5 | 1.5 | 1.5 | 1.5 | 1.5 | 1.5 | 1.5 |
| Silica powder (D) | 1520 | 1520 | 1520 | 1520 | 1520 | 1520 | 1520 | 960 | 400 | 1800 |
| White pigment c1 (C) | 410 | 410 | 410 | 410 | 410 | 410 | 410 | 290 | 170 | 470 |
| White pigment c2 (C) | — | — | — | — | — | — | — | — | — | — |

TABLE 1-continued (parts by weight)

| | Example | | | | | | | | | |
|---|---|---|---|---|---|---|---|---|---|---|
| | 1 | 2 | 3 | 4 | 5 | 6 | 7 | 8 | 9 | 10 |
| Proportion of carboxylic acid (mol %) *1 | | | | | | | | | | |
| Blended carboxylic acid | 4 | 8 | 10 | 18 | 20 | — | — | 8 | 8 | 8 |
| Attributable to water | — | — | — | — | — | 4 | 8 | — | — | — |
| Equivalent ratio (B)/(A) *2 | 0.83 | 0.86 | 0.88 | 0.95 | 0.98 | 0.80 | 0.80 | 0.86 | 0.86 | 0.86 |
| Total proportion (wt %) of white pigment and silica powder | 88 | 88 | 88 | 88 | 88 | 88 | 88 | 83 | 69 | 90 |
| Tg (° C.) | 140 | 135 | 137 | 147 | 151 | 140 | 142 | 138 | 137 | 138 |
| Initial light reflectivity (%) | 92 | 92 | 92 | 92 | 92 | 92 | 92 | 92 | 93 | 90 |
| Blocking resistance | ○ | ○ | ○ | ○ | ○ | ○ | ○ | ○ | ○ | ○ |
| SF value (cm) | 85 | 85 | 85 | 85 | 85 | 85 | 85 | 90 | 210 | 60 |
| Warpage evaluation | ○ | ○ | ○ | ○ | ○ | ○ | ○ | ○ | ○ | ○ |

*1: Proportion of carboxylic acid was calculated from (Amount (mol) of carboxylic acid)/[(Amount (mol) of carboxylic acid) + (Amount (mol) of curing agent)] × 100. Where water was blended, proportion of carboxylic acid was calculated in consideration of (Amount (mol) of added water) = (Amount (mol) of carboxylic acid generated by reaction) = (Amount (mol) of consumed acid anhydride).
*2: Equivalent ratio of active group (acid anhydride group or carboxyl group) reactive with epoxy group in component (B) to 1 equivalent of epoxy group in component (A).

TABLE 2

(parts by weight)

| | Example | | | | | | |
|---|---|---|---|---|---|---|---|
| | 11 | 12 | 13 | 14 | 15 | 16 | 17 |
| Epoxy resin (A) | 100 | 100 | 100 | 100 | 100 | 100 | 100 |
| Curing agent (B) | 106 | 92 | 89 | 132 | 127 | 127 | 121 |
| Carboxylic acid (E) | 14 | 21 | 22 | — | 5.5 | 5.5 | 11 |
| Water (E) | — | — | — | 2.1 | — | — | — |
| Plasticizer f1 (F) | — | — | — | — | 5 | — | — |
| Plasticizer f2 (F) | — | — | — | — | — | 4.3 | 4.3 |
| Curing accelerator | 1 | 1 | 1 | 1 | 1 | 1 | 1 |
| Silane coupling agent a | 2 | 2 | 2 | 2 | 2 | 4 | 4 |
| Silane coupling agent b | 8 | 8 | 8 | 8 | 8 | 7 | 7 |
| Release agent | 2 | 2 | 2 | 2 | 2 | 3 | 32 |
| Antioxidant | — | — | — | — | — | 1.5 | 1.5 |
| Silica powder (D) | 1365 | 1365 | 1365 | 1365 | 1365 | 1400 | 1400 |
| White pigment c1 (C) | — | — | — | — | — | — | — |
| White pigment c2 (C) | 505 | 505 | 505 | 505 | 505 | 500 | 500 |
| Proportion of carboxylic acid (mol %) *1 | | | | | | | |
| Blended carboxylic acid | 11 | 18 | 19 | — | 4 | 4 | 8 |
| Attributable to water | — | — | — | 13 | — | — | — |
| Equivalent ratio (B)/(A) *2 | 0.81 | 0.80 | 0.80 | 0.80 | 0.83 | 0.83 | 0.86 |
| Total proportion (wt %) of white pigment and silica powder | 89 | 89 | 89 | 88 | 88 | 88 | 88 |
| Tg (° C.) | 177 | 177 | 177 | 175 | 154 | 162 | 164 |
| Initial light reflectivity (%) | 90 | 90 | 90 | 90 | 90 | 91 | 92 |
| Blocking resistance | Δ | Δ | Δ | Δ | ○ | ○ | ○ |
| SF value (cm) | 60 | 75 | 80 | 75 | 60 | 65 | 60 |
| Warpage evaluation | ○ | ○ | ○ | ○ | ○ | ○ | ○ |

*1: Proportion of carboxylic acid was calculated from (Amount (mol) of carboxylic acid)/[(Amount (mol) of carboxylic acid) + (Amount (mol) of curing agent)] × 100. Where water was blended, proportion of carboxylic acid was calculated in consideration of (Amount (mol) of added water) = (Amount (mol) of carboxylic acid generated by reaction) = (Amount (mol) of consumed acid anhydride).
*2: Equivalent ratio of active group (acid anhydride group or carboxyl group) reactive with epoxy group in component (B) to 1 equivalent of epoxy group in component (A).

TABLE 3

(parts by weight)

| | Comparative Example | | | |
|---|---|---|---|---|
| | 1 | 2 | 3 | 4 |
| Epoxy resin (A) | 100 | 100 | 100 | 100 |
| Curing agent (B) | 133 | 80 | 121 | 121 |
| Carboxylic acid (E) | — | 28 | 11 | 11 |
| Water (E) | — | — | — | — |
| Plasticizer f1 (F) | 5 | — | 5 | 5 |
| Plasticizer f2 (F) | — | — | — | — |
| Curing accelerator | 1 | 1 | 1 | 1 |
| Silane coupling agent a | 4 | 2 | 4 | 4 |

TABLE 3-continued (parts by weight)

| | Comparative Example | | | |
|---|---|---|---|---|
| | 1 | 2 | 3 | 4 |
| Silane coupling agent b | 7 | 8 | 7 | 7 |
| Release agent | 4 | 2 | 4 | 4 |
| Antioxidant | 1.5 | — | 1.5 | 1.5 |
| Silica powder (D) | 1500 | 1365 | 360 | 3700 |
| White pigment c1 (C) | 410 | — | 160 | 850 |
| White pigment c2 (C) | — | 505 | — | — |
| Proportion of carboxylic acid (mol %) *1 | | | | |
| Blended carboxylic acid | — | 25 | 8 | 8 |
| Attributable to water | — | — | — | — |
| Equivalent ratio (B)/(A) *2 | 0.81 | 0.81 | 0.86 | 0.86 |
| Total proportion (wt %) of white pigment and silica powder | 88 | 89 | 67 | 95 |
| Tg (° C.) | 147 | Unable to knead *3 | 137 | Unable to knead *3 |
| Initial light reflectivity (%) | 92 | | 92 | |
| Blocking resistance | Δ | | ○ | |
| SF value (cm) | 55 | | 220 | |
| Warpage evaluation | ○ | | x | |

*1: Proportion of carboxylic acid was calculated from (Amount (mol) of carboxylic acid)/[(Amount (mol) of carboxylic acid) + (Amount (mol) of curing agent)] × 100. Where water was blended, proportion of carboxylic acid was calculated in consideration of (Amount (mol) of added water) = (Amount (mol) of carboxylic acid generated by reaction) = (Amount (mol) of consumed acid anhydride).
*2: Equivalent ratio of active group (acid anhydride group or carboxyl group) reactive with epoxy group in component (B) to 1 equivalent of epoxy group in component (A).
*3: Resin composition was too viscous to be kneaded, so that evaluation was impossible.

The above results indicate that the epoxy resin compositions of Examples, which each contained the silica powder and the white pigments in a total proportion falling within the predetermined range and contained the carboxylic acid or water in a specific proportion, each provided a higher initial light reflectivity, and had a higher glass transition temperature (Tg), a proper SF measurement value and proper blocking resistance. The epoxy resin compositions of Examples were free from the warpage problem. Therefore, the epoxy resin compositions of Examples each had excellent characteristic properties as the reflector material, and were excellent in moldability, blocking resistance and warpage resistance. Particularly, the epoxy resin compositions of Examples 15, 16, 17, which contained the silica powder and the white pigments in a total proportion falling within the predetermined range and contained the carboxylic acid or water in a specific proportion and further contained neopentyl glycol (divalent alcohol) or trimethylolpropane (trivalent alcohol) as the modifier, had well-balanced characteristic properties, i.e., a higher Tg, proper fluidity and proper blocking resistance, thus providing excellent results.

In contrast, the epoxy resin composition of Comparative Example 1, which contained neither the carboxylic acid nor water, did not suffer from the problem with blocking resistance but suffered from the moldability problem with a lower SF value. The epoxy resin composition of Comparative Example 2, which contained the carboxylic acid or water in an excessively great proportion falling outside the predetermined range, and the epoxy resin composition of Comparative Example 4, which contained the silica powder and the white pigments in an excessively great total proportion falling outside the predetermined range, were too viscous to be kneaded, so that the evaluation for the characteristic properties was impossible. The epoxy resin composition of Comparative Example 3, which contained the silica powder and the white pigments in an excessively small total proportion falling outside the predetermined range, suffered from significant warpage.

[Production of Optical Semiconductor (Light Emitting) Device]

Next, the epoxy resin compositions of Examples were each compacted into tablets, which were used to produce an optical semiconductor (light emitting) device having the construction shown in FIG. 1. A metal lead frame including plural pairs of first and second plate portions 1, 2 made of copper (plated with silver) was placed in a mold of a transfer molding machine, and reflectors 4 were formed at predetermined positions on and in the metal lead frame as shown in FIG. 1 by transfer-molding the epoxy resin composition (by molding at 175° C. for 2 minutes and curing at 175° C. for 3 hours). Then, optical semiconductor (light emitting) elements 3 (each having a size of 0.5 mm×0.5 mm) were mounted on the metal lead frame, and electrically connected to the metal lead frame by bonding wires 7, 8, whereby a unit including the reflectors 4, the metal lead frame and the optical semiconductor elements 3 was produced.

Then, recesses 5 defined by the metal lead frame and inner peripheral surfaces of the reflectors 4 were each filled with a silicone resin (KER-2500 available from Shin-Etsu Silicone Co., Ltd.) to encapsulate the optical semiconductor elements 3 (by molding at 150° C. for 4 hours), whereby transparent encapsulation resin layers 6 were formed. Then, optical semiconductor (light emitting) devices each shown in FIG. 1 were individually separated from each other by dicing for each of the reflectors. The resulting optical semiconductor (light emitting) devices were highly reliable with their reflectors 4 each having a higher initial light reflectivity.

Optical semiconductor devices as shown in FIGS. 2 and 3 and encapsulation type optical semiconductor element units as shown in FIG. 4 were produced by the aforementioned production methods by using the tablets of the epoxy resin compositions of Examples as materials for reflectors 11, 15 thereof. The optical semiconductor devices were highly reliable and excellent as in the aforementioned case. On the other hand, the encapsulation type optical semiconductor element units were each mounted at a predetermined circuit position on a wiring circuit board via connection electrodes thereof, whereby optical semiconductor devices were produced. The optical semiconductor devices thus produced were highly reliable and excellent as in the aforementioned case.

While specific forms of the embodiments of the present invention have been shown in the aforementioned inventive examples, the inventive examples are merely illustrative of the invention but not limitative of the invention. It is contemplated that various modifications apparent to those skilled in the art could be made within the scope of the invention.

The inventive epoxy resin composition for the optical semiconductor device is useful as the material for the reflector which reflects light emitted from the optical semiconductor element incorporated in the optical semiconductor device.

REFERENCE SIGNS LIST

1 FIRST PLATE PORTION
2 SECOND PLATE PORTION
3 OPTICAL SEMICONDUCTOR ELEMENT
4,11,15 REFLECTOR
5 RECESS
6 ENCAPSULATION RESIN LAYER
7,8,12 BONDING WIRE
10 METAL LEAD FRAME
16 ENCAPSULATION LAYER

What is claimed is:

1. An epoxy resin composition for an optical semiconductor device, the epoxy resin composition comprising:
   (A) an epoxy resin;
   (B) a curing agent;
   (C) a white pigment;
   (D) an inorganic filler; and
   (E) at least one of a carboxylic acid and water;
      wherein the components (C) and (D) are present in a total proportion of 69 to 94 wt % based on an amount of the overall epoxy resin composition;
      wherein the component (E) is present in a proportion of 4 to 23 mol % based on a total amount of the components (B) and (E).

2. The epoxy resin composition for the optical semiconductor device according to claim 1, wherein the component (B) is an acid anhydride curing agent.

3. The epoxy resin composition for the optical semiconductor device according to claim 1, wherein the component (C) is present in a proportion of 3 to 90 wt % based on the amount of the overall epoxy resin composition.

4. The epoxy resin composition for the optical semiconductor device according to any claim 1, further comprising:
   (F) a modifier, in addition to the component (A) to (E).

5. The epoxy resin composition for the optical semiconductor device according to claim 4, wherein the modifier (F) is an alcohol compound.

6. The epoxy resin composition for the optical semiconductor device according to claim 1, wherein the component (C) is at least one of titanium oxide and zirconium oxide.

7. The epoxy resin composition for the optical semiconductor device according to claim 1, wherein the component (E) is a solid carboxylic acid.

8. A plate-shaped lead frame for supporting an optical semiconductor element mounted on one of thicknesswise opposite surfaces thereof for an optical semiconductor device, the lead frame comprising:
   a plurality of plate portions spaced from each other by a gap; and
   a reflector formed in the gap by filling the gap with the epoxy resin composition according to claim 1 and curing the epoxy resin composition.

9. A three-dimensional lead frame for an optical semiconductor device, the lead frame comprising:
   an optical semiconductor element mounting region; and
   a reflector at least having a portion surrounding the optical semiconductor element mounting region;
   wherein the reflector is formed by using the epoxy resin composition according to claim 1.

10. The lead frame for the optical semiconductor device according to claim 9, wherein the reflector is provided only on one side of the lead frame.

11. The lead frame for the optical semiconductor device according to claim 8, wherein the reflector is formed by transfer molding or injection molding.

12. An optical semiconductor device comprising:
   plate portions spaced from each other by a gap and having an optical semiconductor element mounting region on one side thereof;
   an optical semiconductor element mounted at a predetermined position on the element mounting region; and
   a reflector formed in the gap by filling the gap with the epoxy resin composition according to claim 1 and curing the epoxy resin composition.

13. An optical semiconductor device comprising:
   a lead frame including an optical semiconductor element mounting region, and a reflector at least having a portion surrounding the element mounting region; and
   an optical semiconductor element provided at a predetermined position on the lead frame;
   wherein the reflector is formed by using the epoxy resin composition according to claim 1.

14. The optical semiconductor device according to claim 13, wherein the optical semiconductor element and the region surrounded by the reflector are sealed with a silicone resin.

15. An encapsulation type optical semiconductor element unit comprising:
   an optical semiconductor element;
   a plurality of connection electrodes provided on a rear surface of the optical semiconductor element;
   a reflector provided on a side surface of the optical semiconductor element and formed from the epoxy resin composition according to claim 1; and
   an encapsulation layer covering an upper surface of the optical semiconductor element serving as a light emitting surface or a light receiving surface.

16. An optical semiconductor device comprising:
   a wiring circuit board; and
   an encapsulation type optical semiconductor element unit mounted at a predetermined position on the wiring circuit board via connection electrodes of the encapsulation type optical semiconductor element unit;
   wherein the encapsulation type optical semiconductor element unit is the encapsulation type optical semiconductor element unit according to claim 15.

17. The epoxy resin composition for the optical semiconductor device according to claim 4, wherein the component (C) is at least one of titanium oxide and zirconium oxide.

18. The epoxy resin composition for the optical semiconductor device according to claim 4, wherein the component (E) is a solid carboxylic acid.

19. The lead frame for the optical semiconductor device according to claim 9, wherein the reflector is formed by transfer molding or injection molding.

* * * * *